United States Patent [19]

Matsuoka

[11] Patent Number: 4,657,328

[45] Date of Patent: Apr. 14, 1987

[54] IC SOCKET

[75] Inventor: Noriyuki Matsuoka, Tokyo, Japan

[73] Assignee: Yamaichi Electric Mfg. Co., Ltd., Tokyo, Japan

[21] Appl. No.: 831,447

[22] Filed: Feb. 20, 1986

[30] Foreign Application Priority Data

Feb. 26, 1985 [JP] Japan ............................ 60-27046[U]

[51] Int. Cl.⁴ ............................................ H01R 13/629
[52] U.S. Cl. ............................ 339/75 MP; 339/17 CF
[58] Field of Search ............ 339/17 CF, 75 M, 75 MP

[56] References Cited

U.S. PATENT DOCUMENTS

| | | | |
|---|---|---|---|
| 3,409,861 | 11/1968 | Barnes et al. | 339/17 CF |
| 4,456,318 | 6/1984 | Shibata et al. | 339/17 CF |
| 4,502,747 | 3/1985 | Bright et al. | 339/75 M |
| 4,504,105 | 3/1985 | Barkus et al. | 339/75 MP |
| 4,515,424 | 5/1985 | Sakurai | 339/17 CF |
| 4,515,425 | 5/1985 | Nakano | 339/17 CF |
| 4,560,216 | 12/1985 | Egawa | 339/17 CF |
| 4,560,217 | 12/1985 | Siano | 339/75 MP |

FOREIGN PATENT DOCUMENTS 59-57462 4/1984 Japan .

Primary Examiner—John McQuade
Attorney, Agent, or Firm—Wenderoth, Lind & Ponack

[57] ABSTRACT

An IC socket comprises a socket body having an IC package accommodating section formed on the upper central portion thereof and also having resilient contacts provided around the section for contact with terminals with an IC package, an IC package pressing cover having its one end pivotally attached to one end of the socket body so that it can be opened and closed relative to the socket body, hook means pivotally attached to the other end of the cover and adapted to engage with and disengage from the other end of the socket body for closing and opening to cover relative to the socket body, first spring means disposed between the socket body and the cover for resiliently supporting the cover and biasing the cover in its opening direction, and second spring means disposed between the cover and the hook means for resiliently supporting the hook means and biasing the hook means in its engaging direction.

4 Claims, 11 Drawing Figures

IC SOCKET

FIELD OF THE INVENTION AND RELATED ART STATEMENT

The present invention related to an IC socket having a mechanism for pressing an IC package to obtain reliable contact between contacts of the IC socket and terminals of the IC package placed on the IC socket.

Generally, an IC package having terminals projected from the side surfaces thereof or formed on the lower edge surface thereof in the shape of a foil is placed on an IC socket having resilient contacts so that the terminals are superposed on the resilient contracts. Therefore, a mechamism for pressing the IC package on the IC socket to retain contact between the terminals and the resilient contacts with high reliability is indispensable to the IC socket.

There have heretofore been proposed various kinds of IC sockets having an IC package pressing mechanism, such as in U.S. Pat. Nos. 4,456,318; 4,515,424; 4,515,425; and 4,560,216 and in Japanese Patent Public Disclosure No. 59-57462, for example. The package pressing mechanism disclosed in the Japanese Patent Public Disclosure No. 59-57462 comprises a press cover pivotally attached to one end of a socket body so that it can be opened and closed relative to the socket body, a lock means pivotally attached to the free end of the press cover so that it can engage with the other end of the socket body to lock the press cover in the closed state, a first spring means for resiliently supporting the press cover and urging the press cover in the direction of opening the press cover relative to the socket body, and a second spring means for resiliently supporting the lock means and urging the lock means in the direction of engaging the press cover with the socket body, whereby disengagement of the lock means against the urging force of the second spring means and opening of the press cover relative to the socket body due to the urging force of the first spring means can be effected simultaneously.

With the conventional pressing mechanism, however, since the lock means is provided on the press cover being opened relative to the socket body by the disengagement of the lock means from the socket body, finger pressure exerted on the lock means for releasing the engagement between the lock means and the socket body presses down the press cover held in the closed state. At this time, even though the finger is released from the lock means, the lock means disengaged from the socket body is spontaneously returned to its locking position by the restoring force of the second spring means and is re-engaged with the socket body (the leading edge of an engaging step of the socket body). Thus there is the possibility of automatic opening of the press cover aimed at by utilization of the first spring means being not accomplished even by operating the lock means to be rotated against the urging force of the second spring means for the purpose of disengaging the lock means from the socket body, because of an actual technical consequence resulting from the structure of the pressing mechanism.

OBJECT AND SUMMARY OF THE INVENTION

The present invention has been established in view of the drawbacks suffered by the conventional IC package pressing mechanism. The main object of the present invention is to provide an IC socket having an IC package pressing mechanism capable of precisely disengaging a hook means provided on an IC package press cover from a socket body and opening the press cover relative to the socket body without giving rise to re-engagement between the hook means and the socket body which has been experienced by the conventional IC socket due to the finger pressure exerted in operating the disengagement of the hook means onto the press cover kept in the closed state, and also capable of effectively making use of the merits of the conventional IC package pressing mechanism having the first and second spring means attached resiliently thereto.

To attain the object described above, according to the present invention, there is provided an IC socket comprising a socket body having an IC package accommodating section formed on the upper central portion thereof and resilient contacts provided around the IC package accommodating section for contact with terminals of an IC package, an IC package pressing cover having one end thereof attached pivotally to one end of the socket body so as to be opened and closed relative to the upper surface of the socket body, hook means pivotally attached to the other end of the pressing cover and adapted to engage with and disengage from the other end of the socket body for closing and opening the pressing cover relative to the upper surface of the socket body, first spring means disposed between the socket body and the pressing cover for resiliently supporting the pressing cover and urging the pressing cover in a direction of opening the pressing cover, second spring means disposed between the pressing cover and the hook means for resiliently supporting the hook means and urging the hook means in a direction of engaging the hook means with the other end of the socket body, the hook means comprising a latch lever being engaged with the other end of the socket body, a push lever being pushed against the urging force of the second spring means in operating the latch lever to be disengaged from the other end of the socket body, and a stopper receiving a pushing force exerted on the push lever in the disengaging operation, colliding with the upper surface of the socket body and raising the pressing cover slightly from the upper surface of the socket body.

The above and other objects and characteristic features and advantages of the present invention will become more apparent to those skilled in the art as the disclosure is made in the following description of preferred embodiments of the invention, as illustrated in the accompanying drawings.

DETAILED DESCRIPTION OF THE PREFERRED EMBODIMENTS

The present invention will now be described with reference to the illustrated embodiments.

Figure 4:
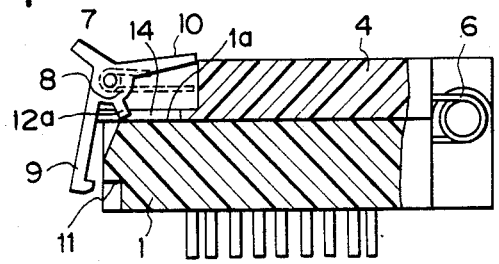
FIGS. 4 and 5 are cross sections illustrating the first embodiment in the process of disengaging hook means from a socket body.
Figure 5:
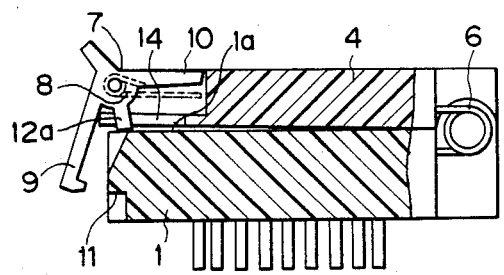
Figure 6:
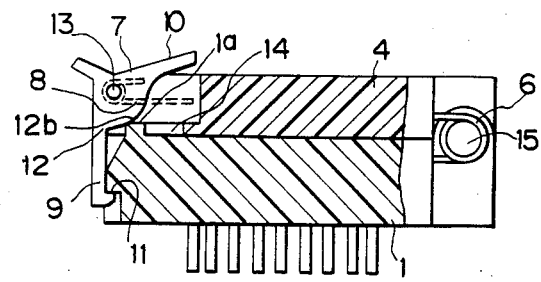
FIG. 6 is a cross section illustrating a second embodiment of the IC socket according to the present invention, with a pressing cover held in its closed state.
Figure 7:
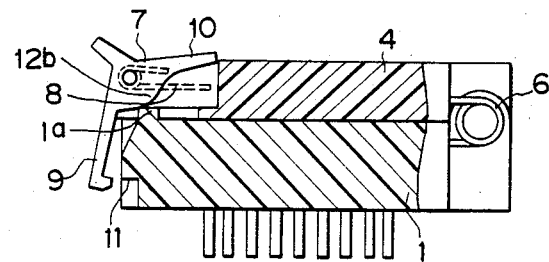
FIGS. 7 and 8 are cross sections illustrating the second embodiment in the process of disengaging hook means from the socket body.
Figure 8:
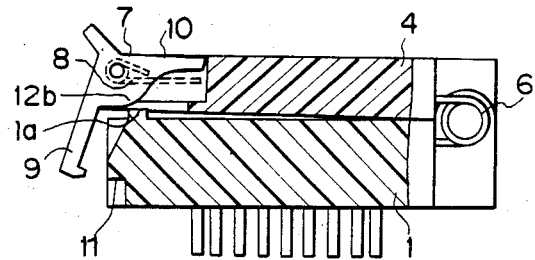
Figure 9:
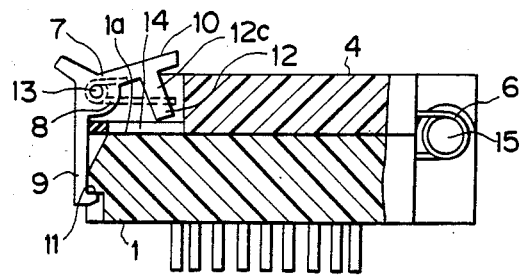
FIG. 9 is a cross section illustrating a third embodiment of the IC socket according to the present invention, with a pressing cover held in its closed state.
Figure 10:
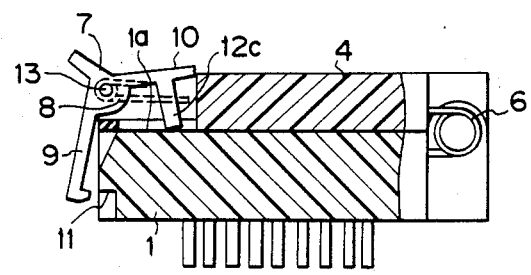
FIGS. 10 and 11 are cross sections illustrating the third embodiment in the process of disengaging hook means from the socket body.
Figure 11:
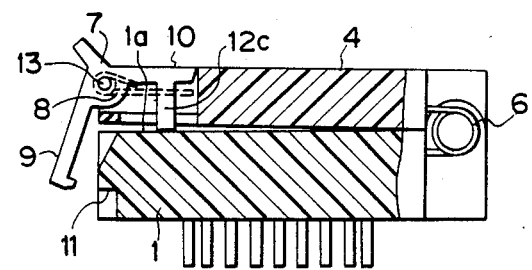

FIGS. 1 to 5 illustrate a first embodiment, FIGS. 6 to 8 a second embodiment and FIGS. 9 to 11 a third embodiment of the IC socket respectively according to the present invention. In any of these embodiments, reference numeral 1 denotes an IC socket body of a square insulation substrate. The socket body 1 is provided at the upper central portion thereof with an IC package accommodating section 2 and around the accommodating section 2 with a plurality of contacts 3 being brought into contact with terminals of an IC package (not shown). As is widely known, each of the contacts 3 has a contact piece exhibiting vertical resiliency, and resilient contact between the contacts 3 of the socket body 1 and the terminals of the IC package can be obtained by accommodating the IC package in the accommodating section 2 of the socket body 1 and then pressing the IC package down with an IC package pressing cover 4. The pressing cover 4 is connected at one end thereof to one end of the socket body 1 by means of shaft couplings 5 and an associated pivot shaft 15 so that it can be closed and opened relative to the upper surface of the socket body 1. Around the opposite ends of the pivot shaft 15 there are inserted a pair of first spring means 6 each formed of a bifurcate coil spring. One end of each of the first spring means 6 is supported on the side of the pressing cover 4 and the other end thereof on the side of the socket body 1. The pressing cover 4 is biased in a direction of opening it relative to the upper surface of the socket body 1 at all times by the pair of first spring means 6 and is closed relative to the upper surface of the socket body 1 by rotating it around the pivot shaft 15 against the biasing force of the first spring means 6.

Referring to FIGS. 1 to 5 illustrating the first embodiment of the IC socket according to the present invention, the IC package pressing cover 4 is provided with hook means 7 which is pivotally attached to the free end of the pressing cover 4 with a pivot 13 and adapted to retain the pressing cover 4 in its closed state relative to the upper surface of the socket body 1. Second spring means 8 formed of a bifurcate spring is inserted around the pivot 13 and has its one end supported on the side of the hook means 7 and its other end supported on the side of the pressing cover 4. The hook means 7 is biased in a direction of engaging it with the free end of the socket body 1 at all times by the second spring means 8. The hook means 7 comprises a latch lever 9 extending from a portion of the hook means 7 in the vicinity of the pivot 13 and having at its leading end a catch claw which is engaged by the force of the second spring means 8 with an engaging step 11 formed in the free end face of the socket body 1 when the pressing cover 4 and the socket body 1 are closed together, a push lever 10 extending from a portion of the hook means 7 in the vicinity of the pivot 13 and connecting to the latch lever 9 so as to form a substantially L-shaped configuration in cooperation with each other, and a stopper 12 formed in the shape of a projecting piece 12a which extends between the latch lever 9 and the push lever 10 and projects radially from the joint portion of the two levers.

Figure 1:
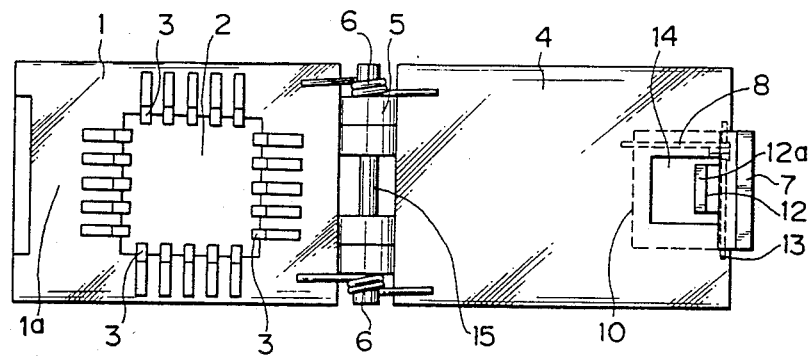
FIG. 1 is a plan view illustrating a first embodiment of the IC socket according to the present invention with a pressing cover held in its open state.
Figure 2:
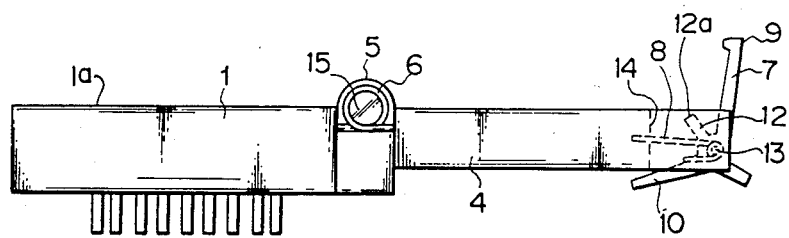
FIG. 2 is a side view illustrating the first embodiment in the same state as in FIG. 1.
Figure 3:
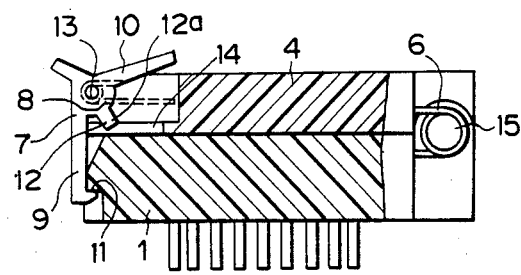
FIG. 3 is a cross section illustrating the first embodiment with an IC package pressing cover held in its closed state.

In the state as shown in FIG. 1 or FIG. 2, an IC package (not shown) is set in position with the IC package accommodating section 2 of the IC socket body 1 and then the IC package pressing cover 4 is rotated about the pivot shaft 15 against the force of the first spring means 6 toward the upper surface of the socket body. As a result, the catch claw of the latch lever 9 of the hook means 7 engages with the engaging step 11 of the socket body 1 by the force of the second spring means 8 as illustrated in FIG. 3. At this time, the latch lever 9 is directed downwardly and has its inside surface colliding with the free end face of the socket body 1, and the push lever 10 is directed toward the pivot shaft 15. Thus, the terminals of the IC package come into resilient contact with the contacts 3 of the socket body 1.

The engagement between the latch lever 9 and the socket body 1 can easily be released by pushing the push lever 10 held in the state of FIG. 3 downwardly as illustrated in FIG. 4. This pushing operation rotates the hook means 7 around the pivot 13 against the force of the second spring means 8. Therefore, the catch claw of the latch lever 9 is moved away from the engaging step 11 of the socket body 1. At this time, the leading end of the projecting piece 12a on the stopper 12 collides with the upper surface of the socket body 1.

A further downward push of the push lever 10 against the biasing force of the second spring means 8 acts on the projecting piece 12a which has collided with the upper surface of the socket body 1. As a result, the pressing cover 4 is slightly raised from the upper surface of the socket body 1 and the catch claw of the latch lever 9 is disposed above the engaging step 11 of the socket body 1, as illustrated in FIG. 5. Consequently, the press cover 4 is opened relative to the upper surface of the socket body 1 by the biasing force of the first spring means 6 without bringing about re-engagement between the hook means 7 and the socket body 1.

FIGS. 6 to 8 illustrate the second embodiment of the IC socket according to the present invention. In the second embodiment, the stopper 12 is formed of a radially expanded portion 12b in place of the projecting piece 12a of the first embodiment projecting radially from the joint portion of the latch lever 9 and the push lever 10. The expanded portion 12b of the stopper 12 is radially expanded from the joint portion of the latch lever 9 and the push lever 10. As is clear from the above, the first and second embodiments make use of the principle of an eccentric cam. Either the projecting piece 12a of the first embodiment or the expanded portion 12b of the second embodiment is brought into collision with the upper surface of the socket body 1 within the range of the rotation of the hook means 7 produced by the pushing operation of the push lever 10. The second embodiment is identical in function and structure with the first embodiment except for use of the expanded portion 12b in place of the projecting piece 12a and, therefore, the detailed description of the second embodiment has been omitted.

FIGS. 9 and 11 illustrate the third embodiment of the IC socket according to the present invention. In this embodiment, the stopper 12 is formed of a protuberance 12c depending from the push lever 10. The protuberance 12c is brought into collision with and supported on the upper surface of the socket body 1 in the course of the rotation of the hook means 7 produced by the pushing operation of the push lever 10, suppresses further rotation of the hook means 7 against the biasing force of the second spring means 8, receives the pushing force of the push lever 10 on the side of the socket body 1, and raises the pressing cover 4 slightly from the upper surface of the socket body, thereby eliminating re-engagement of the hook means 7 with the socket body 1 after stopping the pushing operation of the push lever 10. The third embodiment is identical in function and structure with the first embodiment except for use of the protuberance 12c in place of the projecting piece 12a and, therefore, the detailed description of the third embodiment has been omitted similarly to the second embodiment.

In any of the first to third embodiments, the IC package pressing plate 4 has an opening 14 formed therein immediately below the push lever 10 for accommodating the stopper 12 therein. An upper end face 1a of the socket body 1 is exposed at the opening 14 of the pressing cover 4. Therefore, the stopper 12 does not interfere with the pressing cover 4, but can collide with the upper end face 1a of the socket body 1 by the pushing operation of the push lever 10. The hook means 7 is rotated around the pivot 13 by pushing the push lever 10 against the biasing force of the second spring means 8 until the stopper 12 collides with the upper end face 1a of the socket body 1. A further push of the push lever 10 is given to the socket body 1 via the stopper 12 without pressing the pressing cover 4. As a result, both the pressing cover 4 and the hook means 7 are slightly rotated in the direction of opening the pressing cover 4 as illustrated in FIG. 5, FIG. 8 or FIG. 11, thereby bringing the catch claw at the leading end of the latch lever 9 to a position falling out of the position at which the catch claw can engage with the engaging step 11 of the socket body 1. Therefore, upon releasing the pushing force in this state, the pressing cover 4 can be opened relative to the upper surface of the socket body 1 by the biasing force of the first spring means 6 without entailing re-engagement of the hook means 7 with the socket body 1.

According to the present invention, as described above, it is possible to completely eliminate the drawback suffered by the prior art IC socket that the hook means provided on the free end of the pressing cover is re-engaged with the socket body by the biasing force of the second spring means as the result of the pressing cover kept in the closed state being pressed down during the operation of disengaging the hook means from the socket body against the biasing force of the second spring means. Thus, the present invention not only can effect automatic opening of the pressing cover with exactitude by a single action of the push lever without failing to disengage the hook means from the socket body, but also can effectively make use of the merits of the prior art IC socket provided with an IC package pressing mechanism having the first and second spring means.

What is claimed is:
1. An IC socket comprising:
a socket body having an IC package accommodating section formed on the upper central portion thereof and resilient contacts provided around said IC package accommodating section for contact with terminals of an IC package,
an IC package pressing cover having one end thereof attached pivotally to one end of said socket body so as to be opened and closed relative to the upper surface of said socket body,
hook means pivotally attached to the other end of siad IC package pressing cover and adapted to engage with and disengage from the other end of said socket body for closing and opening said IC package pressing cover relative to the upper surface of said socket body,
first spring means disposed between said socket body and said IC package pressing cover for resiliently supporting said IC package pressing cover and urging said IC package pressing cover in a direction of opening said IC package pressing cover,
second spring means disposed between said IC package pressing cover and said hook means for resiliently supporting said hook means and urging said hook means in a direction of engaging said hook means with the other end of said socket body,
said hook means comprising a latch lever being engaged with the other end of said socket body, a push lever being pushed against the urging force of said second spring means in operating said latch lever to be disengaged from the other end of said socket body, and a stopper receiving a pushing force exerted on said push lever in the disengaging operation, colliding with the upper surface of said socket body and raising said IC package pressing cover slightly from the upper surface of said socket body.
2. An IC socket according to claim 1, wherein said stopper is a projecting piece extending between said latch lever and said push lever and projecting radially from between said latch lever and said push lever.
3. An IC socket according to claim 1, wherein said stopper is an expanded portion of said hook means expanded radially from between said latch lever and said push lever.
4. An IC socket according to claim 1, wherein said stopper is a protuborance depending from said push lever.

* * * * *